(12) United States Patent
Masleid et al.

(10) Patent No.: US 7,710,160 B2
(45) Date of Patent: May 4, 2010

(54) STACKED INVERTER DELAY CHAIN

(76) Inventors: Robert P. Masleid, 17266 Easton La., Monte Sereno, CA (US) 95930; James B. Burr, 511 Broughton La., Foster City, CA (US) 94404

( * ) Notice: Subject to any disclaimer, the term of this patent is extended or adjusted under 35 U.S.C. 154(b) by 142 days.

(21) Appl. No.: 12/037,884

(22) Filed: Feb. 26, 2008

(65) Prior Publication Data
US 2008/0144407 A1 Jun. 19, 2008

Related U.S. Application Data

(63) Continuation of application No. 10/864,271, filed on Jun. 8, 2004, now Pat. No. 7,336,103.

(51) Int. Cl.
*H03K 19/094* (2006.01)
(52) U.S. Cl. .................... 326/121; 327/281; 326/87
(58) Field of Classification Search ............ 326/87, 326/119, 121, 122; 327/281, 288
See application file for complete search history.

(56) References Cited

U.S. PATENT DOCUMENTS

| | | |
|---|---|---|
| 3,991,380 A | 11/1976 | Pryor |
| 4,498,021 A | 2/1985 | Uya |
| 4,700,089 A | 10/1987 | Fujii et al. |
| 4,739,252 A | 4/1988 | Malaviya et al. |
| 4,760,279 A | 7/1988 | Saito et al. |
| 5,039,893 A | 8/1991 | Tomisawa |
| 5,128,560 A | 7/1992 | Chern et al. |
| 5,166,555 A | 11/1992 | Kano |
| 5,227,679 A | 7/1993 | Woo |
| 5,264,738 A | 11/1993 | Veendrick et al. |
| 5,297,086 A | 3/1994 | Nasu et al. |
| 5,410,278 A | 4/1995 | Itoh et al. |
| 5,414,312 A | 5/1995 | Wong |
| 5,455,521 A | 10/1995 | Dobbelaere |
| 5,467,038 A | 11/1995 | Motley et al. |
| 5,497,105 A | 3/1996 | Oh et al. |
| 5,525,616 A | 6/1996 | Platt et al. |
| 5,568,103 A | 10/1996 | Nakashima et al. |
| 5,587,665 A | 12/1996 | Jiang |
| 5,594,360 A | 1/1997 | Wojciechowski |

(Continued)

FOREIGN PATENT DOCUMENTS

EP 1398639 3/2004

(Continued)

OTHER PUBLICATIONS

Lima T et al., "Capacitance Coupling Immune, Transient Sensitive Accelerator For Resistive Interconnect Signals of Subquater Micron ULSI" IEEE Journal of Solid-State Circuits, IEEE Inc. New York, US pp. 531-536.

(Continued)

*Primary Examiner*—Daniel D Chang

(57) ABSTRACT

Stacked inverter delay chains. In accordance with a first embodiment of the present invention, a series stack of two p-type devices is coupled to a series stack of three n-type devices, forming a stacked inverter comprising desirable delay, die area and power characteristics. Two stacked inverters are coupled together to form a stacked inverter delay chain that is more efficient in terms of die area, active and passive power consumption than conventional delay chains comprising conventional inverters.

14 Claims, 3 Drawing Sheets

U.S. PATENT DOCUMENTS

| | | |
|---|---|---|
| 5,610,548 A | 3/1997 | Masleid |
| 5,614,845 A | 3/1997 | Masleid |
| 5,656,963 A | 8/1997 | Masleid et al. |
| 5,677,650 A | 10/1997 | Kwasniewski et al. |
| 5,680,359 A | 10/1997 | Jeong |
| 5,698,994 A | 12/1997 | Tsuji |
| 5,739,715 A | 4/1998 | Rawson |
| 5,764,110 A | 6/1998 | Ishibashi |
| 5,767,700 A | 6/1998 | Lee |
| 5,777,501 A | 7/1998 | AbouSeido |
| 5,778,214 A | 7/1998 | Taya et al. |
| 5,791,715 A | 8/1998 | Nebel |
| 5,796,313 A | 8/1998 | Eitan |
| 5,797,105 A | 8/1998 | Nakaya et al. |
| 5,811,983 A | 9/1998 | Lundberg |
| 5,880,608 A | 3/1999 | Mehta et al. |
| 5,894,419 A | 4/1999 | Galambos et al. |
| 5,926,050 A | 7/1999 | Proebsting |
| 5,963,043 A | 10/1999 | Nassif |
| 5,963,074 A | 10/1999 | Arkin |
| 5,969,543 A | 10/1999 | Erickson et al. |
| 5,977,763 A | 11/1999 | Loughmiller et al. |
| 5,982,211 A | 11/1999 | Ko |
| 6,011,403 A | 1/2000 | Gillette |
| 6,025,738 A | 2/2000 | Masleid |
| 6,028,490 A | 2/2000 | Komatsu |
| 6,031,403 A | 2/2000 | Gersbach |
| 6,069,506 A | 5/2000 | Miller, Jr. et al. |
| 6,087,886 A | 7/2000 | Ko |
| 6,111,447 A | 8/2000 | Ternullo, Jr. |
| 6,114,840 A | 9/2000 | Farrell et al. |
| 6,127,872 A | 10/2000 | Kumata |
| 6,154,099 A | 11/2000 | Suzuki et al. |
| 6,154,100 A | 11/2000 | Okamoto |
| 6,160,755 A | 12/2000 | Norman et al. |
| 6,172,545 B1 * | 1/2001 | Ishii .................. 327/276 |
| 6,172,943 B1 | 1/2001 | Yuzuki |
| 6,188,260 B1 | 2/2001 | Stotz et al. |
| 6,198,334 B1 | 3/2001 | Tomobe et al. |
| 6,204,710 B1 | 3/2001 | Goetting et al. |
| 6,229,747 B1 | 5/2001 | Cho et al. |
| 6,242,936 B1 | 6/2001 | Ho et al. |
| 6,242,937 B1 | 6/2001 | Lee et al. |
| 6,262,601 B1 | 7/2001 | Choe et al. |
| 6,275,091 B1 | 8/2001 | Saeki |
| 6,281,706 B1 | 8/2001 | Wert et al. |
| 6,285,230 B1 | 9/2001 | Na |
| 6,294,930 B1 | 9/2001 | Goetting et al. |
| 6,321,282 B1 | 11/2001 | Horowitz et al. |
| 6,323,706 B1 | 11/2001 | Stark et al. |
| 6,366,115 B1 | 4/2002 | DiTommaso |
| 6,407,571 B1 | 6/2002 | Furuya et al. |
| 6,426,641 B1 | 7/2002 | Koch et al. |
| 6,426,652 B1 | 7/2002 | Greenhill et al. |
| 6,455,901 B2 | 9/2002 | Kameyama et al. |
| 6,459,319 B2 | 10/2002 | Sako |
| 6,466,063 B2 | 10/2002 | Chen |
| 6,476,632 B1 | 11/2002 | La Rosa et al. |
| 6,489,796 B2 | 12/2002 | Tomishima |
| 6,535,014 B2 | 3/2003 | Chetlur et al. |
| 6,538,471 B1 | 3/2003 | Stan et al. |
| 6,538,522 B1 | 3/2003 | Aipperspach et al. |
| 6,545,519 B1 | 4/2003 | Carballo |
| 6,570,407 B1 | 5/2003 | Sugisawa et al. |
| 6,573,777 B2 | 6/2003 | Saint-Laurent et al. |
| 6,577,157 B1 | 6/2003 | Cheung et al. |
| 6,577,176 B1 | 6/2003 | Masleid et al. |
| 6,621,318 B1 | 9/2003 | Burr |
| 6,657,504 B1 | 12/2003 | Deal et al. |
| 6,664,837 B1 | 12/2003 | Oh et al. |
| 6,690,242 B2 | 2/2004 | Fang et al. |
| 6,697,929 B1 | 2/2004 | Cherkauer et al. |
| 6,724,214 B2 | 4/2004 | Manna et al. |
| 6,731,140 B2 | 5/2004 | Masleid et al. |
| 6,731,179 B2 | 5/2004 | Abadeer et al. |
| 6,759,863 B2 | 7/2004 | Moore |
| 6,762,638 B2 | 7/2004 | Correale, Jr. et al. |
| 6,762,966 B1 | 7/2004 | LaRosa et al. |
| 6,768,363 B2 | 7/2004 | Yoo et al. |
| 6,774,734 B2 | 8/2004 | Christensen et al. |
| 6,798,230 B1 | 9/2004 | Taylor et al. |
| 6,815,971 B2 | 11/2004 | Wang et al. |
| 6,815,977 B2 | 11/2004 | Sabbavarapu et al. |
| 6,831,494 B1 | 12/2004 | Fu et al. |
| 6,879,200 B2 | 4/2005 | Komura et al. |
| 6,882,172 B1 | 4/2005 | Suzuki et al. |
| 6,885,210 B1 | 4/2005 | Suzuki |
| 6,903,564 B1 | 6/2005 | Suzuki |
| 6,924,669 B2 | 8/2005 | Itoh et al. |
| 7,053,660 B2 | 5/2006 | Itoh et al. |
| 7,053,680 B2 | 5/2006 | Masleid et al. |
| 7,119,580 B2 | 10/2006 | Masleid et al. |
| 7,142,018 B2 | 11/2006 | Masleid et al. |
| 7,173,455 B2 | 2/2007 | Masleid et al. |
| 7,239,170 B2 | 7/2007 | Suen et al. |
| 7,271,638 B2 | 9/2007 | Takai et al. |
| 7,295,041 B1 | 11/2007 | Masleid et al. |
| 7,304,503 B2 | 12/2007 | Masleid et al. |
| 7,336,103 B1 | 2/2008 | Masleid et al. |
| 2001/0000426 A1 | 4/2001 | Sung et al. |
| 2001/0028278 A1 | 10/2001 | Ooishi |
| 2001/0030561 A1 | 10/2001 | Asano et al. |
| 2001/0052623 A1 | 12/2001 | Kameyama et al. |
| 2002/0056016 A1 | 5/2002 | Horowitz et al. |
| 2002/0178415 A1 | 11/2002 | Saraf |
| 2003/0005775 A1 | 1/2003 | Washeleski et al. |
| 2003/0011413 A1 | 1/2003 | Masleid |
| 2003/0042960 A1 | 3/2003 | Gomm |
| 2003/0057775 A1 | 3/2003 | Yamashita et al. |
| 2003/0160630 A1 | 8/2003 | Earle |
| 2003/0189465 A1 | 10/2003 | Abadeer et al. |
| 2003/0231713 A1 | 12/2003 | Masleid et al. |
| 2004/0104731 A1 | 6/2004 | Vollertsen |
| 2004/0119501 A1 | 6/2004 | Sabbavarapu et al. |
| 2004/0119503 A1 | 6/2004 | Jamshidi et al. |
| 2004/0124900 A1 | 7/2004 | Brox |
| 2004/0148111 A1 | 7/2004 | Gauthier et al. |
| 2004/0257115 A1 | 12/2004 | Bertram et al. |
| 2005/0184720 A1 | 8/2005 | Bernstein et al. |
| 2005/0212547 A1 | 9/2005 | Suzuki |
| 2005/0248368 A1 | 11/2005 | Bertram et al. |

FOREIGN PATENT DOCUMENTS

| | | |
|---|---|---|
| JP | 03089624 A | 4/1991 |
| JP | 04091516 A | 3/1992 |
| JP | 06216723 | 8/1994 |

OTHER PUBLICATIONS

Nalamalpu, et al., 'Boosters for Driving Long OnChip Interconnects-Design Issues, Interconnect Synthesis, and Comparison with Repeaters, Jan. 2002, IEEE Transactions on Computer-Aided Design of Integrated Circuits and Systems, vol. 21, No. 1, pp. 50-62.

Chen, G et al., "DynamicNBTI of p-MOS Transistors and its Impact on MOSFET Scaling" IEE Electron Device Letters, 2002.

Oner et al., "A Compact Monitoring Circuit for Real-Time On-Chip Diagnosis of Hot-Carrier Induced Degradation" Microelectronic test structures. Proceedings, IEEE International Conference in Monterey, Ca. Mar. 17, 1997-Mar. 20, 1997, pp. 72-76.

Reddy. V. et al., "Impact of Negative Bias Temperature Instability on Digital Circuit Reliability". 2002 IEE International Reliabilty Physics Symposium Proceedings, Dallas, TX Apr. 7, 2002-Apr. 11, 2002.

Ryhoei Kaneda, Translation of Japanese Kokai Patent Application No. Hei [1991]-89624, publication date: Apr. 15, 1991, pp. 1-6.

Rhyne, "Fundamentals of Digital Systems Design", N.J. 1973, pp. 70-71.

Stojanovic, V. and Oklobdzija, V., "Comparative Analysis of Master-Slave Latches and Flip-Flops for High-Performance and Low-Power Systems", IEEE Journal of Solid-State Circuits, vol. 34, No. 4, Apr. 1999, pp. 536-548.

Taub, et al., Digital Integrated Electronics, 1977, McGraw-Hill, Inc. pp. 98-100.

* cited by examiner

STACKED INVERTER DELAY CHAIN

CROSS-REFERENCE TO RELATED APPLICATIONS

This is a continuation of U.S. patent application Ser. No. 10/864,271 filed Jun. 8, 2004, which is incorporated herein in its entirety

BACKGROUND OF THE INVENTION

It is sometimes advantageous to delay propagation of a signal through an integrated circuit. A common approach to create such signal delays is to insert a delay circuit into a signal path. It is usually desirable for a delay circuit design to track delay changes (e.g., due to process, voltage and/or temperature variations) of other circuits on an integrated circuit. Likewise, delay circuit designs should be efficient in terms of integrated circuit die area, active power consumption and static power (leakage current) consumption.

SUMMARY OF THE INVENTION

Embodiments in accordance with the present invention relate to stacked inverter delay chains. In accordance with a first embodiment of the present invention, a series stack of two p-type devices is coupled to a series stack of three n-type devices, forming a stacked inverter comprising desirable delay, die area and power characteristics. Two stacked inverters are coupled together to form a stacked inverter delay chain that is more efficient in terms of die area, active and passive power consumption than conventional delay chains comprising conventional inverters.

In accordance with another embodiment of the present invention, stacks of varying numbers of devices per leg of a stacked inverter are disclosed. Increasing a number of devices per leg can result in beneficial increases in signal propagation delay and reductions in leakage current.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

In the following detailed description of the present invention, stacked inverter delay chain, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Stacked Inverter Delay Chain

Embodiments in accordance with the present invention are described in the context of design and operation of integrated semiconductors. More particularly, embodiments of the present invention relate to stacked inverter delay chains. It is appreciated, however, that elements of the present invention may be utilized in other areas of semiconductor design and operation.

The following description of embodiments in accordance with the present invention is directed toward pFETs (or p-type metal oxide semiconductor field effect transistors (MOSFETS)) formed in surface N-wells and/or nFETs (or n-type MOSFETS) formed in surface P-wells when a p-type substrate and an N-well process are utilized. It is to be appreciated, however, that embodiments in accordance with the present invention are equally applicable to nFETs (or n-type MOSFETS) formed in surface P-wells and/or pFETs (or p-type MOSFETS) formed in surface N-wells when an n-type substrate and a P-well process are utilized. Consequently, embodiments in accordance with the present invention are well suited to semiconductors formed in both p-type and n-type materials, and such embodiments are considered within the scope of the present invention.

Figure 1:
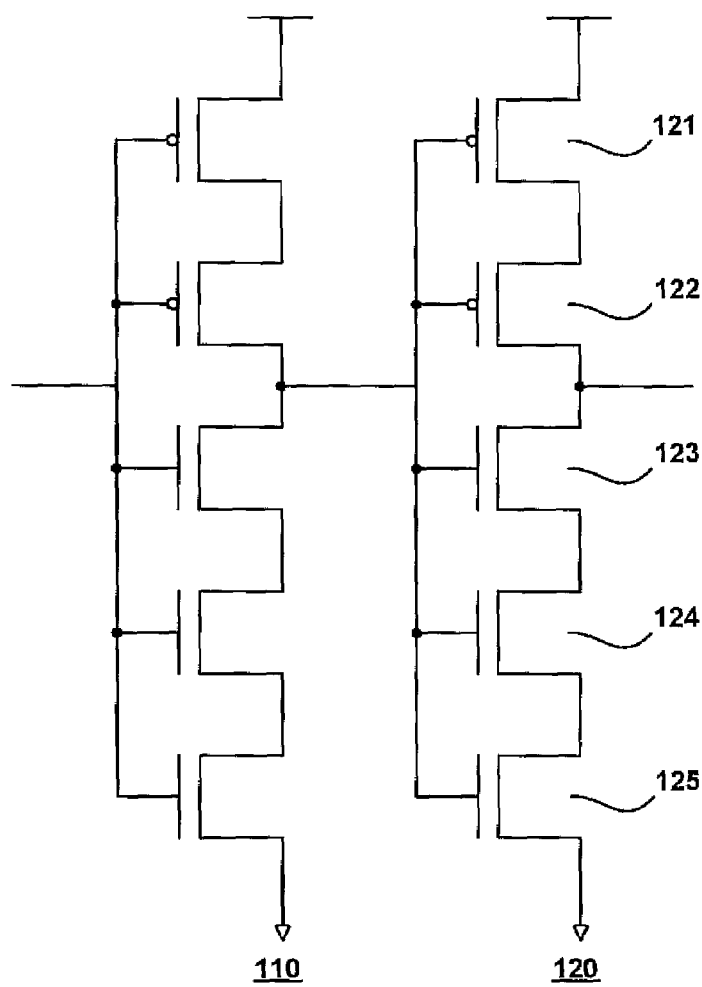
FIG. 1 illustrates a schematic of a stacked inverter delay chain, in accordance with embodiments of the present invention.

FIG. 1 illustrates a schematic of a novel stacked inverter delay chain 100, in accordance with embodiments of the present invention. Stacked inverter delay chain 100 comprises stacked inverters 110 and 120. The output of stacked inverter 110 is coupled to the input of stacked inverter 120. It is to be appreciated that additional stacked inverter delay chains, e.g., one or more instances of stacked inverter delay chain 100, can be coupled to stacked inverter delay chain 100 to achieve larger signal delay values.

In contrast to a conventional inverter, stacked inverters 110 and 120 comprise more than a single p-type device coupled to a single n-type device. Rather, stacked inverters 110 and 120 comprise multiple p-type devices and multiple n-type devices. More particularly, stacked inverter 120 comprises two p-type devices 121 and 122 and three n-type devices 123, 124 and 125. The gates of the devices of stacked inverter 120 are coupled together forming the input of the inverter stage. The output of the inverter stage may be taken at the coupling of a p-type device to an n-type device.

In contrast to a conventional inverter, however, stacked inverter 120 comprises multiple series devices per "leg." For example, two p-type devices are configured to pull the output high (when appropriate) and three n-type devices are configured to pull the output low. Consequently, the drive capability of stacked inverter 120 is less than the drive capability of a conventional inverter. Beneficially, such decreased drive capability produces an increased delay of a signal through stacked inverter 120.

Additionally, and also of benefit, stacked inverter 120 presents an increased load to its driving circuitry, in comparison to a conventional inverter. For example, a signal input to stacked inverter 120 is coupled to five active devices as opposed to being coupled to two active devices in a conventional inverter. Each device presents an input capacitance. Such increased loading produces a further desirable increase in signal propagation delay.

An approximate analysis of stacked inverter delay chain 100 indicates that the delay of stacked inverter 120 is about six times the delay of a conventional two-device inverter. For example, drive resistance of stacked inverter 120 can be about 2.5 times the drive resistance of a conventional inverter, and load capacitance of stacked inverter 120 can be about 2.5 times the load capacitance of a conventional inverter. If stacked inverter 110 is constructed similarly, the delay through stacked inverter delay chain 100 will be about 12 times longer than through a conventional inverter pair. In different terms, a delay through stacked inverter delay chain 100 is approximately the same as a delay through a chain of 12 stages of conventional inverters. It is appreciated that an exacting evaluation is the province of circuit simulation and the details of a particular semiconductor manufacturing process.

A chain of 12 conventional inverters comprising 24 active devices has approximately the same delay as stacked inverter delay chain 100 comprising ten active devices. Consequently, the active switching power of stacked inverter delay chain 100 is beneficially reduced to approximately 42 percent (10 divided by 24) of the active switching power of a conventional delay circuit, for about the same delay.

In addition to a reduction in the number of active devices required for a comparable delay, a beneficial reduction is realized in integrated circuit die area required by stacked inverter delay chain 100. As a consequence of utilizing fewer active components than a conventional delay circuit, stacked inverter delay chain 100 comprises about 42 percent of the die area for active devices than a conventional delay circuit, for approximately the same delay. However, there is yet another additional integrated circuit die area benefit realized by stacked inverter delay chain 100 over the conventional art.

Figure 2:
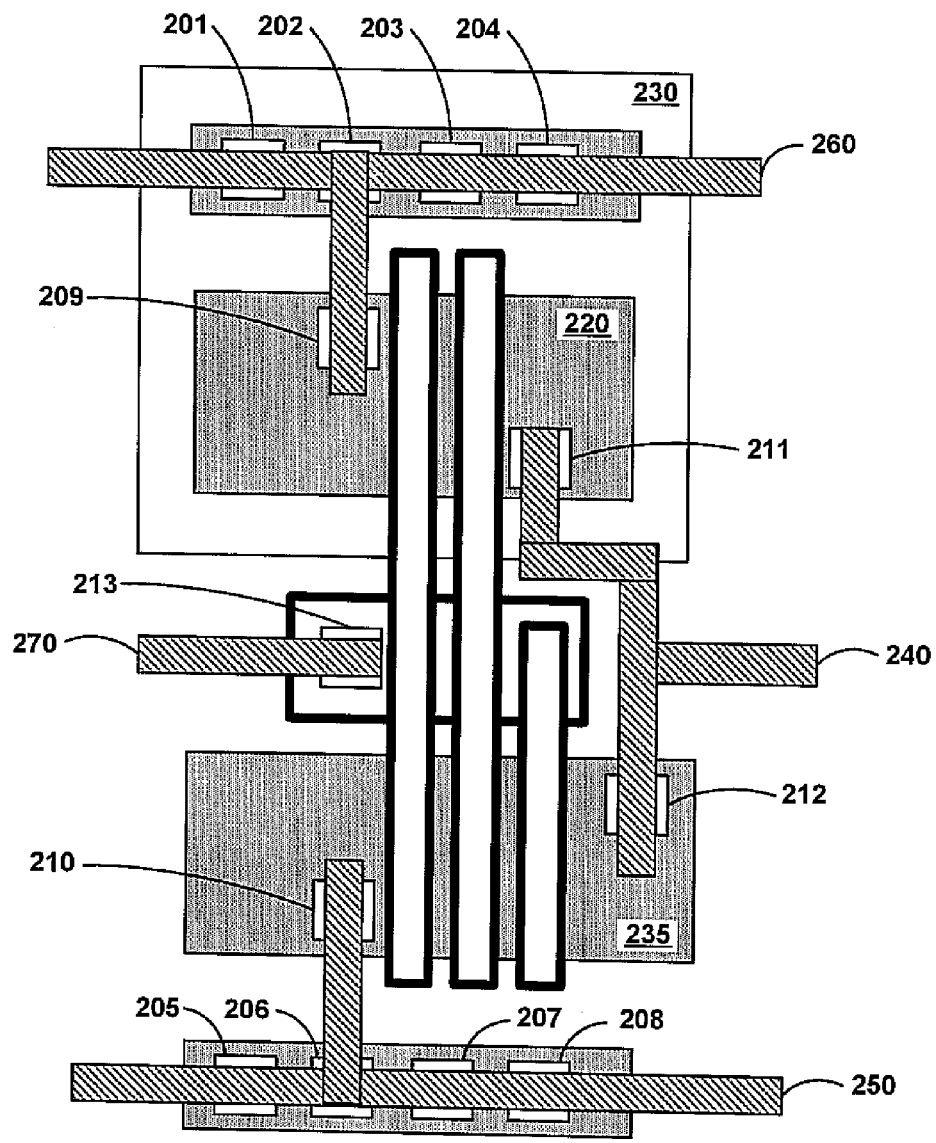
FIG. 2 illustrates an exemplary layout of a stacked inverter, in accordance with embodiments of the present invention.

FIG. 2 illustrates an exemplary layout of stacked inverter 120, in accordance with embodiments of the present invention. It is appreciated that FIG. 2 is not drawn to scale.

Stacked inverter 120 comprises two p-type devices (121, 122 of FIG. 1) formed in p-type diffusion within n-well 220. Stacked inverter 120 comprises three n-type devices (123, 124, 125 of FIG. 1) formed in n-type diffusion. Metallization 240 couples p-type diffusion 220 with n-type diffusion 235, coupling p-type device 122 (FIG. 1) with n-type device 123 (FIG. 1) and forming the output of stacked inverter 120 (FIG. 1).

Metallization 260 couples p-type device 121 (FIG. 1) to an operating voltage, e.g., Vdd. Metallization 250 couples n-type device 125 (FIG. 1) to ground. Metallization 270 couples an input signal to the gates of all devices.

In a conventional art delay circuit, all diffusion regions require a contact. For example, in the conventional art, contacts are required to connect a transistor to a later stage and/or to connect a transistor to a transistor of opposite type. Thus, a conventional art inverter chain requires about 5 contacts per stage. For example, a conventional art inverter stage would typically comprise one contact to couple Vdd to the p-type device, one contact to couple ground to the n-type device, one contact to couple the inverter output to the p-type device, one to couple the inverter output to the n-type device and one contact for the input. Twelve stages of inverters thus require about 60 contacts. It is appreciated that additional contacts are generally required for coupling Vdd and ground to the wells.

In contrast, in accordance with embodiments of the present invention, stacked inverter delay chain 100 requires far fewer contacts to produce about the same delay as a conventional 12-stage inverter delay chain. In contrast to the conventional art, stacked inverter 120 has no need of contacts within its stacks. For example, no contact is necessary between p-type devices 121 and 122 (FIG. 1), nor is a contact necessary between n-type devices 123 and 124 (FIG. 1), nor is a contact necessary between n-type devices 124 and 125 (FIG. 1). For example, one contact couples p-type device 121 (FIG. 1) to Vdd (contact 209), and one contact couples n-type device 125 (FIG. 1) to ground (contact 210). One contact couples p-type device 122 (FIG. 1) to the output (contact 211), and one contact couples n-type device 123 (FIG. 1) to the output (contact 212). One contact couples the input to all devices (contact 213). Consequently, stacked inverter 120 can be constructed utilizing a total of about ten contacts. Exemplary contacts 201-208 are illustrated coupling Vdd and ground to the wells. It is appreciated that such contacts are commonly interspersed at intervals, e.g., every tenth row of logic, and thus may not be strongly associated with a particular circuit.

Therefore, in contrast to a conventional art inverter delay chain requiring about 60 contacts, stacked inverter delay chain 100 requires only about 10 contacts, or one sixth as many contacts to produce about the same delay. Consequently, embodiments in accordance with the present invention yield highly advantageous integrated circuit die area reductions far beyond a reduction in transistor count.

A further benefit of stacked inverter delay chain 100 derives from utilizing fewer stages in comparison to the conventional art. Consequently, embodiments in accordance with the present invention require less wiring to intercouple stages and fewer inter-stage spaces to separate stages. Such requirements for less wiring and less space result in a desirable reduction in integrated circuit die area required for such wiring and spaces.

It is to be appreciated that static power consumption in modern semiconductor processes, e.g., processes with a minimum feature size of about 0.13 microns and smaller, is no longer a negligible component of total power consumption. For such processes, static power may be one-half of total power consumption. Further, static power, as a percentage of total power, is tending to increase with successive generations of semiconductor process.

Embodiments in accordance with the present invention offer significant advantages in reducing static power consumption in comparison with the conventional art. A conventional art inverter delay chain comprises a leakage path for each inverter, e.g., a series "string" of devices from operating voltage (Vdd) to ground. Thus, a 12 inverter delay chain comprises 12 leakage paths. In contrast, stacked inverter delay chain 100 comprises just two leakage paths. Consequently, stacked inverter delay chain 100 comprises one sixth of the leakage paths.

Further, such leakage paths within stacked inverter delay chain 100 suffer less leakage than conventional inverters, yielding additional beneficial leakage reductions. In a conventional inverter, exactly one transistor is on while the other transistor is off. As an unfortunate consequence, approximately the full bias voltage is applied to the off transistor, resulting in a maximum possible leakage for the off transistor.

In contrast, referring once again to FIG. 1, in stacked inverter 120 multiple transistors are either on or off in series. For example, for a "high" output state, transistors 121 and 122 are on, while transistors 123, 124 and 125 are off. Consequently, each off transistor (123-125) has significantly less than full bias voltage applied. For example, for a high output, each transistor 123, 124 and 125 will have about one third of full bias voltage applied. It is appreciated that leakage current generally decreases exponentially as voltage decreases. For example, a two times reduction in off bias voltage produces about an eight times reduction in leakage current per leakage path.

It is to be further appreciated that such leakage induces non zero voltages at intermediate nodes between the off transistors, e.g., between transistors 125 and 124, and between transistors 124 and 123. Such voltages induce body biasing effects in the transistors. Such body biasing effects increase the threshold voltage of the affected transistors. An increased threshold voltage generally produces beneficial decreases in leakage current.

Consequently, in addition to a decrease in a number of leakage paths, in accordance with embodiments of the present invention, the leakage current of each path is very beneficially reduced due to an induced body biasing effect and a highly non-linear relationship between bias voltage and leakage current. An approximate analysis indicates that total leakage current of stacked inverter delay chain 100 is reduced about 50 times in comparison to a conventional delay chain of inverters, for the same delay.

Another aspect of merit regarding delay circuits is the ability of a delay circuit to track speed changes of other circuitry of an integrated circuit. It is appreciated that a variety of factors, e.g., operating voltage, operating temperature and/or manufacturing process variations, can affect the speed of operation of an integrated circuit. It is generally desirable for a delay circuit to track speed changes of other circuitry of an integrated circuit. For example, if other circuits of an integrated circuit operate faster, generally less absolute delay is required from a delay circuit for the overall circuit to function. Because embodiments in accordance with the present invention comprise stacked devices, they are similar to many logic circuits that also comprise stacked devices, e.g., NAND and/or NOR logic gates. Consequently, embodiments in accordance with the present invention match or track changes in operating speed of complex logic more accurately than delay chains comprising very simple inverters.

Embodiments in accordance with the present invention are thus shown to offer significant and highly beneficial improvements in tracking timing changes of other circuits, integrated circuit die area, active power consumption and static power (leakage current) consumption in comparison to the conventional art.

Figure 3:
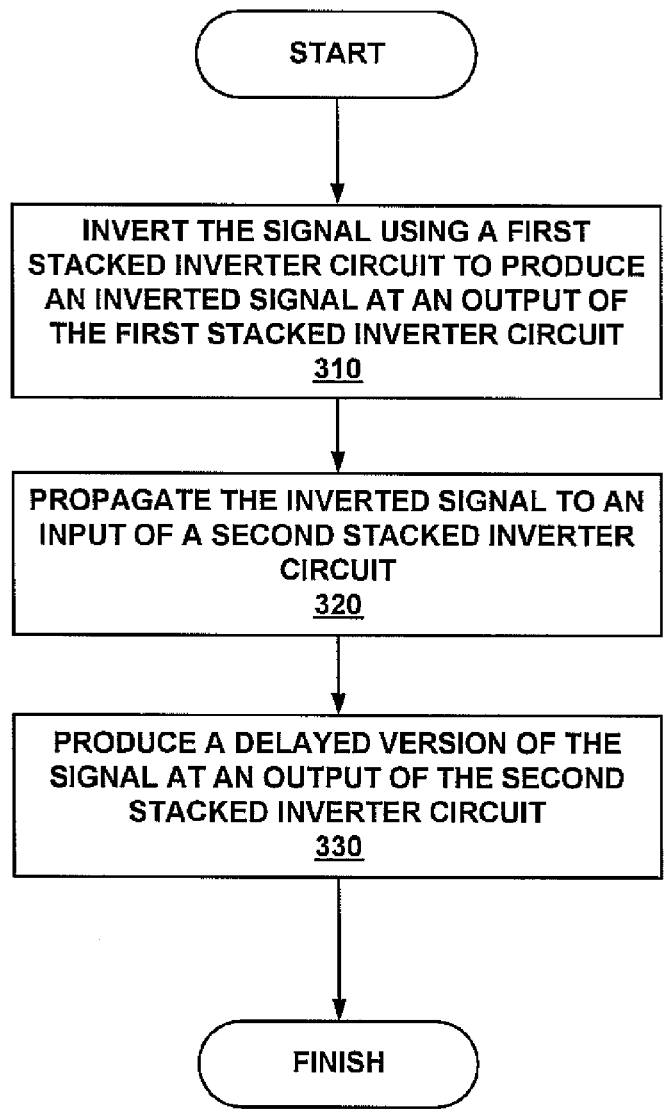
FIG. 3 illustrates a flow chart of steps in a method of delaying a signal, in accordance with embodiments of the present invention.

FIG. 3 illustrates a flow chart of steps in a method of delaying a signal 300, in accordance with embodiments of the present invention. In block 310, the signal is inverted using a first stacked inverter circuit to produce an inverted signal at an output of the first stacked inverter circuit. For example, the inverted signal is the output of stacked inverter chain 110 of FIG. 1.

In block 320, the inverted signal is propagated to an input of a second stacked inverter circuit, e.g., at the input of stacked inverter chain 120 of FIG. 1. In block 330, a delayed version of the signal is produced at an output of the second stacked inverter circuit. For example, in reference to FIG. 1, a delayed version of the input to stacked inverter circuit 110 is produced at the output of stacked inverter chain 110. In accordance with embodiments of the present invention, the first and the second stacked inverter circuits comprise at least five active devices.

It is to be appreciated physical differences between electrons and holes, and between n-type and p-type dopants, as well as constructive differences in device geometry and dopant placement, result in differences in efficiency between n-type devices and p-type devices. Because electron mobility is higher than hole mobility, n-type devices are more efficient than p-type devices. However, the degree of difference depends on constructive differences that can vary with process. Such physical and constructive differences also produce other behavior differences, such as a difference in sensitivity to body effects. Consequently, different levels of benefit, e.g., in leakage reduction, are to be expected between stacks of n-type devices and stacks of p-type devices. To allow for such effects, in accordance with embodiments of the present invention, it is possible to stack different numbers of transistors on either or both legs of a stacked inverter. Such variations allow increases in load and/or decreases in drive capability, enabling a wide variety of delay values, as well as enabling differing body biasing effects.

For example, depending upon a wide variety of factors, including, e.g., details of a semiconductor process, required delay, active power budget and/or static power budget, a delay circuit comprising multiple stacked inverter circuits, each comprising three or more p-type devices in conjunction with three or more n-type devices, may better optimize available resources than stacked inverter delay circuit 100 (FIG. 1).

It is to be appreciated that conventional integrated circuit design practice generally teaches away from embodiments in accordance with the present invention. For example, much of the art generally teaches design of "fast" circuits. In most areas of integrated circuit design, a great deal of effort is devoted to design details that contribute to an increased speed (frequency) of operation, e.g., reducing input capacitance and increasing output drive. For example, in contrast to conventional teaching and practice, stacked inverter chain 120 comprises stacked transistors without an intermediate buffer, reducing output drive capability and slowing the circuit down. Further, stacked inverter chain 120 comprises multiple inputs that all have the same logical purpose, increasing input capacitance and further slowing the circuit down.

Further, embodiments in accordance with the present invention are contrary to the operation of conventional integrated circuit design tools. For example, conventional design synthesis tools will routinely "optimize" redundancy out of a design. For example, stacked inverter 120 (FIG. 1) comprises two field effect transistors in series driven by the same input. From a logic design perspective, such a structure may be considered redundant. Thus, conventional design synthesis tools will routinely reduce stacked inverter 120 to a conventional two-device inverter. Consequently, a designer may be required to take custom efforts to retain and embody a novel stacked inverter in accordance with embodiments of the present invention when utilizing conventional design tools.

Embodiments in accordance with the present invention provide a stacked inverter comprising desirable delay, die area and power characteristics. Further embodiments in accordance with the present invention provide for coupling two stacked inverters together to form a stacked inverter delay chain that is more efficient in terms of die area, active and passive power consumption than conventional delay chains comprising conventional inverters. Still further embodiments in accordance with the present invention provide for stacks of varying numbers of devices per leg of a stacked inverter.

Embodiments in accordance with the present invention, stacked inverter delay chain, are thus described. While the present invention has been described in particular embodiments, it should be appreciated that the present invention should not be construed as limited by such embodiments, but rather construed according to the below claims.

What is claimed is:

1. A circuit comprising:
   a first stacked inverter including a first plurality of active devices of a first type and a second plurality of active devices of a second type; and
   a second stacked inverter including a third plurality of active device of the first type and a fourth plurality of active devices of the second type, wherein the output of the first stacked inverter is coupled to the input of the second staked inverter, and wherein a total number of the third plurality is not equal to the fourth plurality in the second stacked inverter.

2. The circuit of claim 1, wherein the active device is a field effect transistor.

3. The circuit of claim 1, wherein the active device is a metal oxide semiconductor filed effect transistor.

4. The circuit of claim 1, wherein the first stacked inverter and second stacked inverter are substantially the same.

5. The circuit of claim 1, wherein the first type of active device is a p-type device and the second type of active device is an n-type device.

6. A stacked inverter comprising:
a first plurality of transistors of a first type coupled in series with each other, wherein a first end of the first plurality of transistors is coupled to a first potential; and
a second plurality of transistors of a second type coupled in series with each other, wherein a first end of the second plurality of transistors is coupled to a second potential, the gates of the first and second plurality of transistors are coupled together as an input, the second end of the first and second plurality of transistors are coupled together as an output and a total number of transistors of the first type is different than a total number of the second type.

7. The stacked inverter of claim 6, wherein the transistor is a field effect transistor.

8. The stacked inverter of claim 6, wherein the transistor is a metal oxide semiconductor filed effect transistor.

9. The stacked inverter of claim 6, wherein the first type of transistor is a type transistor and the second type of transistor is an n-type transistor.

10. The stacked inverter of claim 6, wherein:
the first plurality of transistors of the first type comprises three n-type transistors; and
the second plurality of transistors of the second type comprises two p-type transistors.

11. A method of fabricating a stacked inverter comprising:
forming a first plurality of transistors from sequential p-type diffusions in an n-well;
forming a second plurality of transistors from sequential n-type diffusions in a p-well, wherein a total number of the first plurality is different from a total number of the second plurality;
forming a first metallization coupling a first end of the sequential p-type diffusions and a first end of the sequential n-type diffusions as an output of the stacked inverter;
forming a second metallization coupling a second end of the sequential p-type diffusions to a first potential;
forming a third metallization coupled a second end of the sequential n-type diffusions to a second potential; and
forming a fourth metallization coupling a gate of each of the first and second plurality of transistors as an input of the staked inverter.

12. The method according to claims 11, wherein the transistor is a field effect transistor.

13. The method according to claim 11, wherein the transistor is a metal oxide semiconductor filed effect transistor.

14. The method according to claim 11, wherein:
the first plurality of transistors of the first type comprises three n-type transistors; and
the second plurality of transistors of the second type comprises two p-type transistors.

* * * * *